(12) United States Patent
Zainordin et al.

(10) Patent No.: US 11,616,176 B2
(45) Date of Patent: Mar. 28, 2023

(54) OPTOELECTRONIC COMPONENT WITH A HOUSING BODY AND AN OPTICAL ELEMENT BOTH INCLUDING A REFLECTOR

(71) Applicant: OSRAM Opto Semiconductors GmbH, Regensburg (DE)

(72) Inventors: Mohd Fauzi Zainordin, Penang (MY); Khairul Mohd Arshad, Penang (MY); Sok Gek Beh, Penang (MY); Jun Jun Lim, Melaka (MY)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 142 days.

(21) Appl. No.: 16/647,782

(22) PCT Filed: Apr. 10, 2018

(86) PCT No.: PCT/EP2018/059167
§ 371 (c)(1),
(2) Date: Mar. 16, 2020

(87) PCT Pub. No.: WO2019/063137
PCT Pub. Date: Apr. 4, 2019

(65) Prior Publication Data
US 2020/0235269 A1 Jul. 23, 2020

(30) Foreign Application Priority Data

Sep. 28, 2017 (WO) .................. PCT/EP2017/074673

(51) Int. Cl.
*H01L 33/58* (2010.01)
*H01L 33/48* (2010.01)
(Continued)

(52) U.S. Cl.
CPC ............ *H01L 33/58* (2013.01); *H01L 33/486* (2013.01); *H01L 33/60* (2013.01); *H01L 33/62* (2013.01)

(58) Field of Classification Search
CPC ......... H01L 33/58; H01L 33/60; H01L 33/62; H01L 33/486
See application file for complete search history.

(56) References Cited

U.S. PATENT DOCUMENTS 8,564,968 B1 * 10/2013 Heo ........................ H01L 23/10
361/767
8,742,655 B2 6/2014 Veerasamy et al.
(Continued)

FOREIGN PATENT DOCUMENTS

EP 2734780 A2 5/2014
WO 2011123984 A1 10/2011

*Primary Examiner* — Thanhha S Pham
(74) *Attorney, Agent, or Firm* — Slater Matsil, LLP

(57) ABSTRACT

An optoelectronic component is disclosed. In an embodiment an optoelectronic component includes a housing body, an optical element and a rabbet comprising a shoulder and a cheek, wherein the rabbet is located on an upper side of the housing body, wherein the optical element is located in the rabbet such that a brim of the optical element rests on the shoulder of the rabbet, wherein the upper side of the housing body comprises a rectangular shape, and wherein the shoulder of the rabbet is located only at corners of the rabbet.

16 Claims, 5 Drawing Sheets

(51) Int. Cl.
 *H01L 33/60* (2010.01)
 *H01L 33/62* (2010.01)

(56) References Cited

U.S. PATENT DOCUMENTS

| | | | |
|---|---|---|---|
| 8,952,410 B2* | 2/2015 | Kim | G02B 19/0028 |
| | | | 257/98 |
| 9,544,484 B2* | 1/2017 | Kim | H01L 33/58 |
| 2008/0111145 A1 | 5/2008 | Lin | |
| 2009/0027884 A1* | 1/2009 | Chou | H01L 33/486 |
| | | | 362/240 |
| 2010/0252851 A1 | 10/2010 | Emerson et al. | |
| 2013/0049049 A1* | 2/2013 | Choi | H01L 33/58 |
| | | | 257/98 |
| 2013/0322068 A1* | 12/2013 | Clark | H01S 5/0231 |
| | | | 362/235 |
| 2016/0005931 A1* | 1/2016 | Lee | H01L 33/505 |
| | | | 257/98 |
| 2016/0047528 A1* | 2/2016 | Goldstein | H01L 25/075 |
| | | | 362/311.02 |
| 2016/0126414 A1* | 5/2016 | Ahn | H01L 33/644 |
| | | | 257/98 |
| 2018/0006202 A1* | 1/2018 | Kim | H01L 33/486 |

* cited by examiner

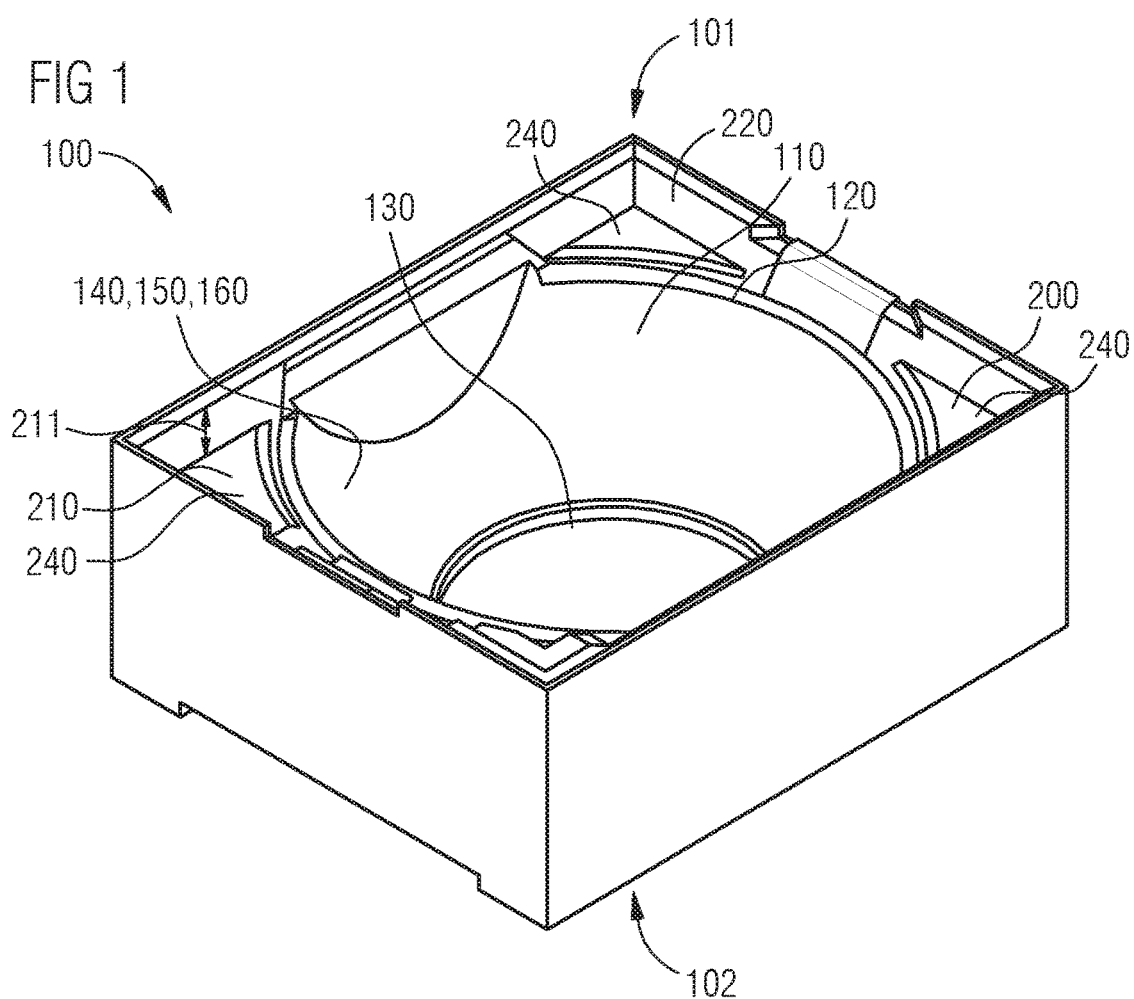
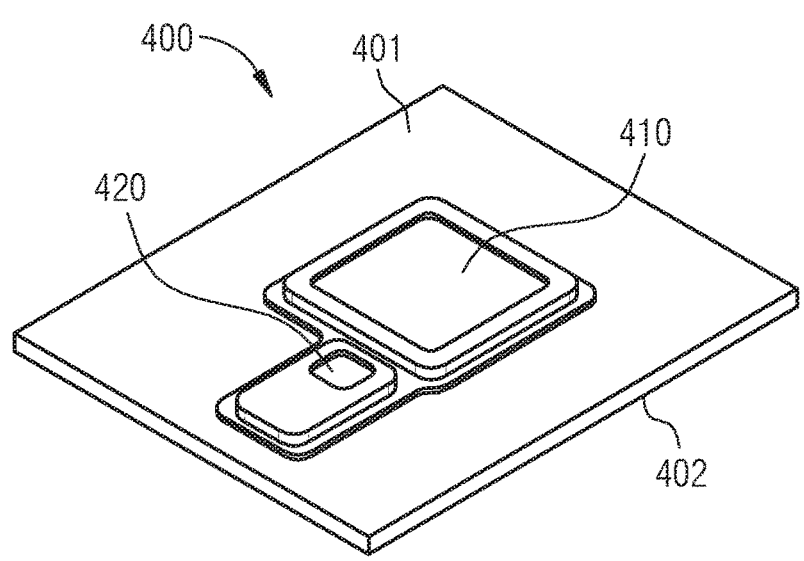

OPTOELECTRONIC COMPONENT WITH A HOUSING BODY AND AN OPTICAL ELEMENT BOTH INCLUDING A REFLECTOR

This patent application is a national phase filing under section 371 of PCT/EP2018/059167, filed Apr. 10, 2018, which claims the priority of PCT/EP2017/074673, filed Sep. 28, 2017, each of which is incorporated herein by reference in its entirety.

TECHNICAL FIELD

The present invention relates to an optoelectronic component.

BACKGROUND

Optoelectronic components with integrated optical elements are known in the state of the art. It is known to provide optoelectronic components with housing bodies with integrated optical reflectors and optical elements arranged on the housing body.

SUMMARY OF THE INVENTION

Embodiments provide an optoelectronic component.

An optoelectronic component comprises a housing body and an optical element. A rabbet comprising a shoulder and a cheek is formed on an upper side of the housing body. The optical element is received in the rabbet such that a brim of the optical element rests on the shoulder of the rabbet.

Advantageously, the rabbet of the housing body protects the optical element of this optoelectronic component against an accidental removal. In particular, the rabbet may protect the optical element from being pulled or sheared off. This decreases the risk of damaging the optoelectronic component.

According to an embodiment of the optoelectronic component, a height of the rabbet differs from a thickness of the brim of the optical element by less than 40%, preferably by less than 20%, preferably by less than 10%. Advantageously, the rabbet of the housing body provides a particularly effective protection of the optical element in the case that the height of the rabbet and the thickness of the brim of the optical element are approximately equal.

In an embodiment of the optoelectronic component, a gap is formed between the brim of the optical element and the cheek of the rabbet. The gap comprises a width below 200 µm or below 100 µm. Advantageously, a gap with such a width both allows an easy mounting of the optical element on the housing body and provides a precise alignment of the optical element relative to the housing body.

In an embodiment of the optoelectronic component, an obtuse angle is enclosed between the cheek of the rabbet and the shoulder of the rabbet. Advantageously, the obtuse angle simplifies mounting of the optical element in the rabbet of the housing body of the optoelectronic component. The obtuse angle provides an automatic centring of the optical element in the rabbet of the housing body.

In an embodiment of the optoelectronic component, a glue is arranged between the shoulder of the rabbet and the brim of the optical element. Advantageously, the glue fixates the optical element in the rabbet. A further advantage of the rabbet is that the cheek of the rabbet prevents the glue from being squeezed out to the outside of the housing body. Furthermore, the rabbet may serve to increase the contact surface between the housing body, the glue and the optical element, increasing the adhesion between the housing body and the optical element.

In an embodiment of the optoelectronic component, the glue extends to a region between the cheek of the rabbet and the brim of the optical element. Advantageously, glue arranged in the region between the cheek of the rabbet and the brim of the optical element increases the contact surface between the rabbet of the housing body, the glue and the brim of the optical element, thus increasing adhesion between the housing body and the optical element.

In an embodiment of the optoelectronic component, the upper side of the housing body comprises a rectangular shape. The shoulder of the rabbet is formed only at the corners of the rabbet. Advantageously, this allows a construction of the housing body of the optoelectronic component with very small outer dimensions.

In an embodiment of the optoelectronic component, the housing body comprises a cavity having an opening at the upper side of the housing body. Advantageously, the cavity of the housing body may serve to house an optoelectronic semiconductor chip of the optoelectronic component.

In an embodiment of the optoelectronic component, the rabbet encircles the opening of the cavity. Advantageously, this allows the rabbet to support and hold the optical elements in multiple spatial directions.

In an embodiment of the optoelectronic component, the optical element covers the opening of the cavity. Advantageously, light emitted inside the cavity passes the optical element before being radiated from the optoelectronic component. A further advantage of the optical element covering the opening of the cavity is that the optical element provides protection for components of the optoelectronic component arranged inside the cavity.

In an embodiment of the optoelectronic component, a side wall of the cavity forms a reflector. Advantageously, the reflector formed by the side wall of the cavity may serve to reflect and converge light emitted by an optoelectronic semiconductor chip arranged in the cavity of the housing body of the optoelectronic component.

In an embodiment of the optoelectronic component, the reflector comprises a gold coating. Advantageously, the reflector comprises a high reflectivity and is insensitive to aging.

In an embodiment of the optoelectronic component, the glue partially covers the reflector. Advantageously, the glue covering parts of the reflector may serve to improve the homogeneity of light radiated from the optoelectronic component.

In an embodiment of the optoelectronic component, the optical element comprises an optical lens. Advantageously, the optical lens may serve to form light radiated from the optoelectronic component.

In an embodiment of the optoelectronic component, the optical lens is arranged on a lower side of the optical element. The optical lens extends into the cavity. Advantageously, this allows for a particularly compact construction of the optoelectronic component. Having the optical lens arranged on the lower side of the optical element and inside the cavity allows the outer side of the optical element to be flat, providing a uniform and insensitive outer appearance of the optoelectronic component.

In an embodiment of the optoelectronic component, the lens is asymmetric. Advantageously, an asymmetric optical lens allows to deflect light in one selected direction such that the optoelectronic component comprises a tilted viewing angle.

In an embodiment of the optoelectronic component, the optoelectronic component comprises a carrier having a die attach pad arranged on an upper side of the carrier and a solder pad arranged on a lower side of the carrier. The housing body is arranged on the upper side of the carrier. Advantageously, the carrier of the optoelectronic component may serve to carry one or more optoelectronic semiconductor chips and other components of the optoelectronic component. The carrier may also serve to electrically connect electric components of the optoelectronic component.

In an embodiment of the optoelectronic component, at least one via contact extends through the carrier between the die attach pad and the solder pad. Advantageously, the via contact may serve to remove heat generated by an optoelectronic semiconductor chip arranged on the die attach pad of the carrier.

In an embodiment of the optoelectronic component, a lower side of the housing body comprises a cut-out. An optoelectronic semiconductor chip is arranged on the die attach pad of the carrier in the cut-out of the housing body. Advantageously, the optoelectronic semiconductor chip may serve to emit electromagnetic radiation. The optoelectronic semiconductor chip may be an LED chip, for example. The optoelectronic semiconductor chip may be designed to emit light in the visible range or the IR range, for example.

A further optoelectronic component comprises a housing body with a cavity and comprises an optical element with an outer surface. The optical element is arranged on the housing body such that the outer surface faces a side wall of the cavity. Advantageously, this optoelectronic component comprises compact outer dimensions. The optical element of this optoelectronic component can serve to collect light emitted by an optoelectronic semiconductor chip of this optoelectronic component. To this end, the outer surface of the optical element can serve as a reflective surface at which light is reflected by total internal reflection. Advantageously, this may eliminate the need for an additional reflector element.

In an embodiment of the optoelectronic component, the optical element comprises an optical lens. The optical lens extends into the cavity. The optical lens comprises the outer surface. Advantageously, the optical lens of the optical element being arranged in the cavity of the housing body of the optoelectronic component allows for a compact design of the optoelectronic component.

In an embodiment of the optoelectronic component, the optical lens is asymmetric. Advantageously, an asymmetrical optical lens allows to deflect light in one selected direction such that the optoelectronic component comprises a tilted viewing angle.

In an embodiment of the optoelectronic component, the optical lens is a TIR lens. Advantageously, this allows for a compact design of the optical lens. A further advantage is that the optical lens being designed as a TIR lens comprises a central funnel that allows light emitted at a large angle to enter the optical lens. This light may then reach the outer surface of the optical element and may be reflected at the outer surface of the optical element by total internal reflection such that the light emitted at a large angle is collected and concentrated.

In an embodiment of the optoelectronic component, an optoelectronic semiconductor chip is arranged in the cavity. Light emitted by the optoelectronic semiconductor chip is at least partially coupled into the optical element and is at least partially reflected by total internal reflection on the outer surface. Advantageously, the optical element of this optoelectronic component serves to collect and concentrate light emitted by the optoelectronic semiconductor chip. This may allow to design the optoelectronic component without further reflectors.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings, in which, in schematic representation;

FIG. 1 shows a perspective view of a housing body of an optoelectronic component;

FIG. 2 shows a perspective view of a carrier of an optoelectronic component;

DETAILED DESCRIPTION OF ILLUSTRATIVE EMBODIMENTS

Figure 3:
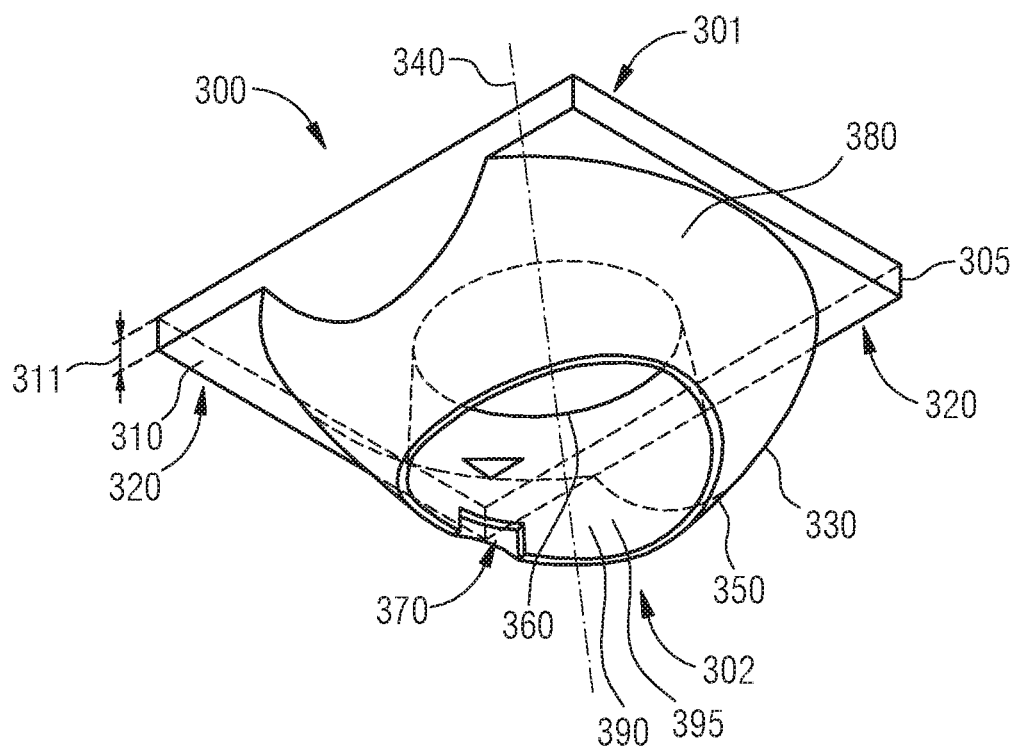
FIG. 3 shows a perspective view of an optical element of an optoelectronic component.

FIG. 1 shows a perspective view of a housing body 100 in schematic depiction. The housing body 100 is designed to be a part of a package of an optoelectronic component, for example, a light emitting diode component.

The housing body 100 comprises an approximately cuboid shape with an upper side 101 and a lower side 102 opposed to the upper side 101.

The housing body 100 comprises a cavity 110. The cavity no has an opening 120 at the upper side 101 of the housing body 100. At the lower side 102 of the housing body 100, the cavity no forms a cut-out 130. Together, the cavity no forms a tunnel extending through the housing body 100 between the opening 120 at the upper side 101 of the housing body and the cut-out 130 at the lower side 102 of the housing body 100.

The opening 120 at the upper side 101 of the housing body 100 has a larger area than the cut-out 130 at the lower side 102 of the housing body 100. Between the cut-out 130 and the opening 120 the cavity no widens such that a side wall 140 of the cavity no is convex.

The side wall 140 of the cavity no forms a reflector 150. To this end, the side wall 140 of the reflector 150 may comprise a gold coating 160. The gold coating 160 may, however, be omitted.

The housing body 100 may comprise a plastic material, for example, a black polyphthalamide (PPA). The housing body 100 may be produced by molding, for example.

The housing body 100 comprises a rabbet 200 arranged at the upper side 101 of the housing 100. The rabbet 200 comprises a rectangular shape and extends along the outer edges of the upper side 101 of the housing body 100.

Consequently, the rabbet 200 encircles the opening 120 of the cavity no. The rabbet 200 may also be referred to as a frame.

The rabbet 200 comprises a shoulder 210 and a cheek 220. The shoulder 210 is oriented parallel to the upper side 101 of the housing body 100 and is offset from the upper side 101 of the housing body 100. The cheek 220 of the rabbet 200 is oriented upwards and encloses the shoulder 210 of the rabbet 200. The cheek 220 comprises a height 211 measured in a direction perpendicular to the upper side 101 of the housing body 100 such that the shoulder 210 of the rabbet 200 is offset with respect to the upper side 101 by the height 211.

The cheek 220 of the rabbet 200 may be oriented perpendicular to the shoulder 210 of the rabbet. It is also possible that an obtuse angle 230 larger than 90° is enclosed between the cheek 220 of the rabbet 200 and the shoulder 210 of the rabbet 200. The figure shows an embodiment in which the angle 230 is obtuse with more than 90°.

Near corners 240 of the rectangular rabbet 200, the shoulder 210 of the rabbet 200 has an extensive area, while at the centres of the edges of the upper side 101 of the housing body 100, the opening 120 of the cavity no extends up to the cheek 220 of the rabbet 200 such that the width of the shoulder 210 diminishes to zero. Consequently, the shoulder 210 of the rabbet 200 is formed only at the corners 240 of the rabbet 200.

FIG. 2 shows a schematic perspective view of a carrier 400. The carrier 400 can be a printed circuit board (PCB), for example. The carrier 400 has a flat shape with an upper side 401 and a lower side 402 opposed to the upper side 401.

A die attach pad 410 and a wire attach pad 420 are arranged at the upper side 401 of the carrier 400.

Figure 4:
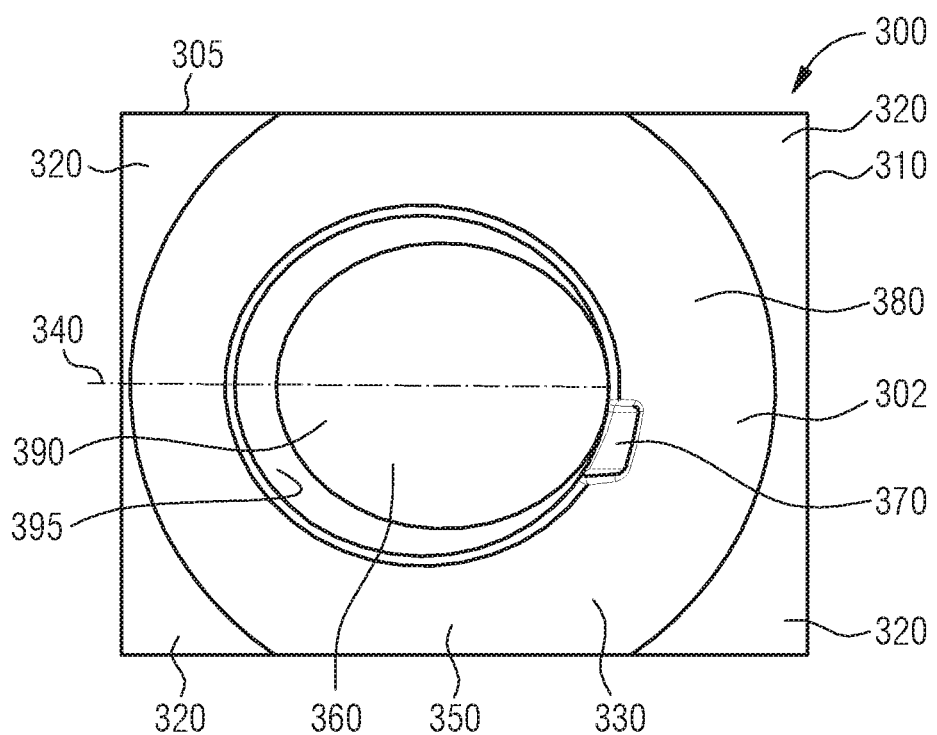
FIG. 4 shows a bottom side of the optical element comprising an optical lens.

FIG. 3 shows a schematic perspective view of an optical element 300. FIG. 4 shows a schematic bottom view of the optical element 300. The optical element 300 comprises an optically transparent material and is designed for forming light that passes through the optical element 300. The optical element 300 may comprise an epoxy, for example. The optical element 300 may be produced by molding, for example.

The optical element 300 comprises a rectangular board 305 with an upper side 301 and a lower side 302 opposed to the upper side 301. The board 305 comprises a thickness 311 measured between the upper side 301 and the lower side 302.

The upper side 301 of the board 305 of the optical element 300 is flat. In other embodiments however, the upper side 301 of the board 305 of the optical element 300 may be structured.

At the lower side 302 of the board 305, the optical element 300 comprises an optical lens 330. The optical lens 330 is attached to the lower side 302 of the board 305 and covers only a central part of the lower side 302 of the board 305 such that the projecting pails of the board 305 form a brim 310. The pails of the lower side 302 of the board 305 that are not covered by the optical lens 330 form bearing surfaces 320. The bearing surfaces 320 are the parts of the lower side 302 of the parts of the board 305 that forms the brim 310.

The optical lens 330 is a converging lens and is designed as a TIR (Total Internal Reflection) lens with an outer section 350 and an inner section 360 in the example depicted in FIGS. 3 and 4. The optical lens 330 may, however, be designed differently, for example as a spherical convex lens.

The optical lens 330 of the optical element 300 being designed as a TIR lens means that the inner section 360 of the optical lens 330 is offset with respect to the outer section 350 such that an outer surface 380 of the optical lens 330 at the lower side 302 of the optical element 300 has a discontinuity at the transition between the outer section 350 in the inner section 360 of the optical lens 330. The inner section 360 is offset relative to the outer section 350 of the optical lens 330 such that a funnel 390 is formed at the lower side 302 of the optical element 300. The funnel 390 comprises a funnel wall 395 that connects the outer surface 380 of the outer section 350 of the optical lens 330 to the outer surface 380 of the inner section 360 of the optical lens 330.

In the example depicted in FIGS. 3 and 4, the optical lens 330 is asymmetric. An optical axis 340 of the optical lens 330 of the optical element 300 is oriented not perpendicular to the upper side 301 and the lower side 302 of the board 305 of the optical element 300, but inclined with respect to a direction perpendicular to the lower side 302 of the board 305 of the optical element 300. In other embodiments however, the optical lens 330 may be symmetric.

Figure 5:
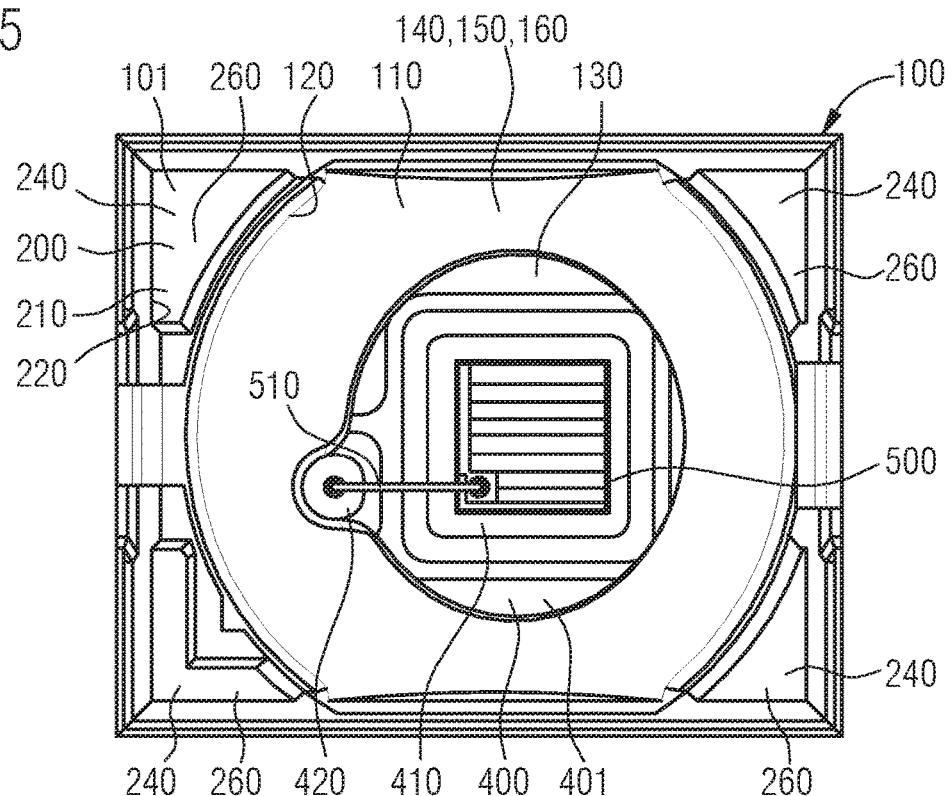
FIG. 5 shows a top view of the housing body, the carrier and an optoelectronic semiconductor chip.

FIG. 5 shows a schematic top view of the housing body wo of FIG. 1 and the carrier 400 of FIG. 2 in a partially assembled state.

An optoelectronic semiconductor chip 500 has been arranged on the die attach pad 410 on the upper side 401 of the carrier 400. The optoelectronic semiconductor chip 500 has been electrically connected to the wire attach pad 420 on the upper side 401 of the carrier 400 with a bond wire 510. The optoelectronic semiconductor chip 500 is designed for emitting electromagnetic radiation, for example, visible light. The optoelectronic semiconductor chip 500 may be a light emitting diode chip (LED chip), for example. The optoelectronic semiconductor chip 500 may be designed to emit light in the visible range or the IR range, for example.

The housing body 100 has been arranged above the upper side 401 of the carrier 400 such that the lower side 102 of the housing body 100 faces the upper side 401 of the carrier 400. The optoelectronic semiconductor chip 500 and the bond wire 510 are arranged in the cut-out 130 of the cavity 110 of the housing body 100 such that the optoelectronic semiconductor chip 500 is arranged inside the cavity 110 of the housing body 100.

It is possible to arrange the housing body 100 above the upper side 401 of the carrier 400 before or after arranging the optoelectronic semiconductor chip 500 on the die attach pad 410 at the upper side 401 of the carrier 400.

A glue 260 has been arranged on the shoulder 210 of the rabbet 200 of the housing body 100 in the corners 240 of the rabbet 200. The glue 260 may have been attached by stamping, for example. It is possible to apply the glue 260 to the shoulder 210 such that at first only parts of the shoulder 210 are covered by the glue 260. Afterwards, the glue 260 may spread to cover most or all of the surface of the shoulder 210 of the rabbet 200.

Figure 6:
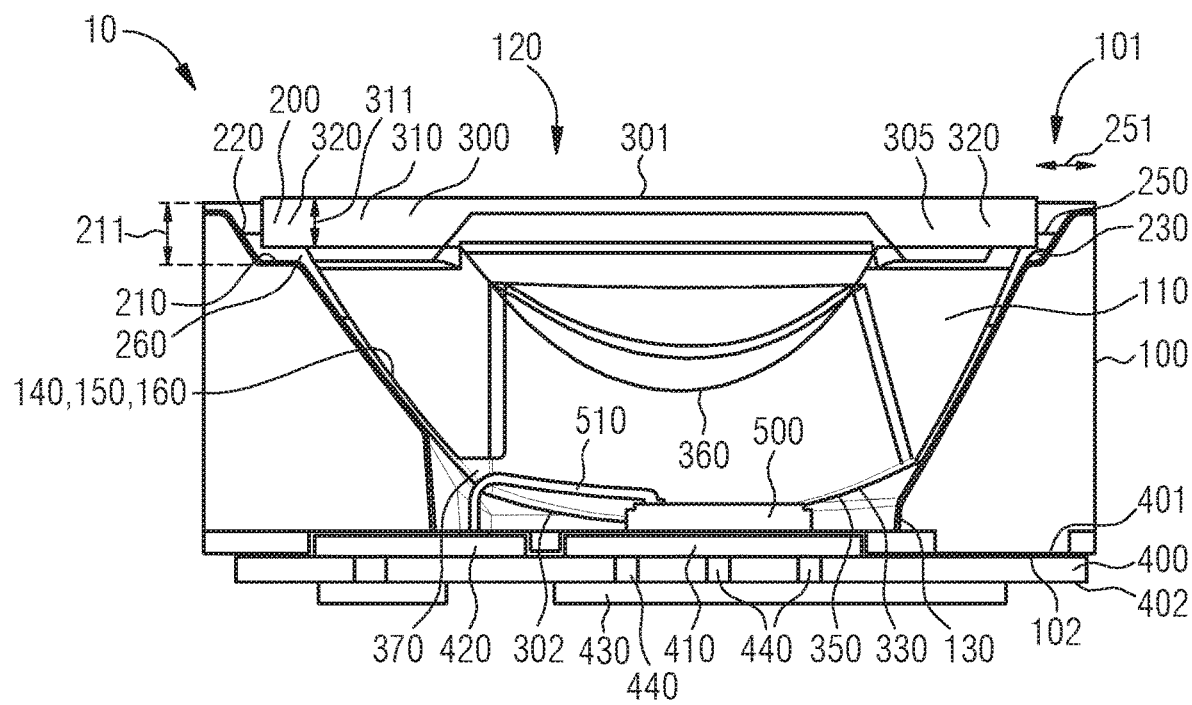
FIG. 6 shows a sectional view of an optoelectronic component comprising the carrier, the housing body, the optoelectronic semiconductor chip and the optical element.
Figure 7:
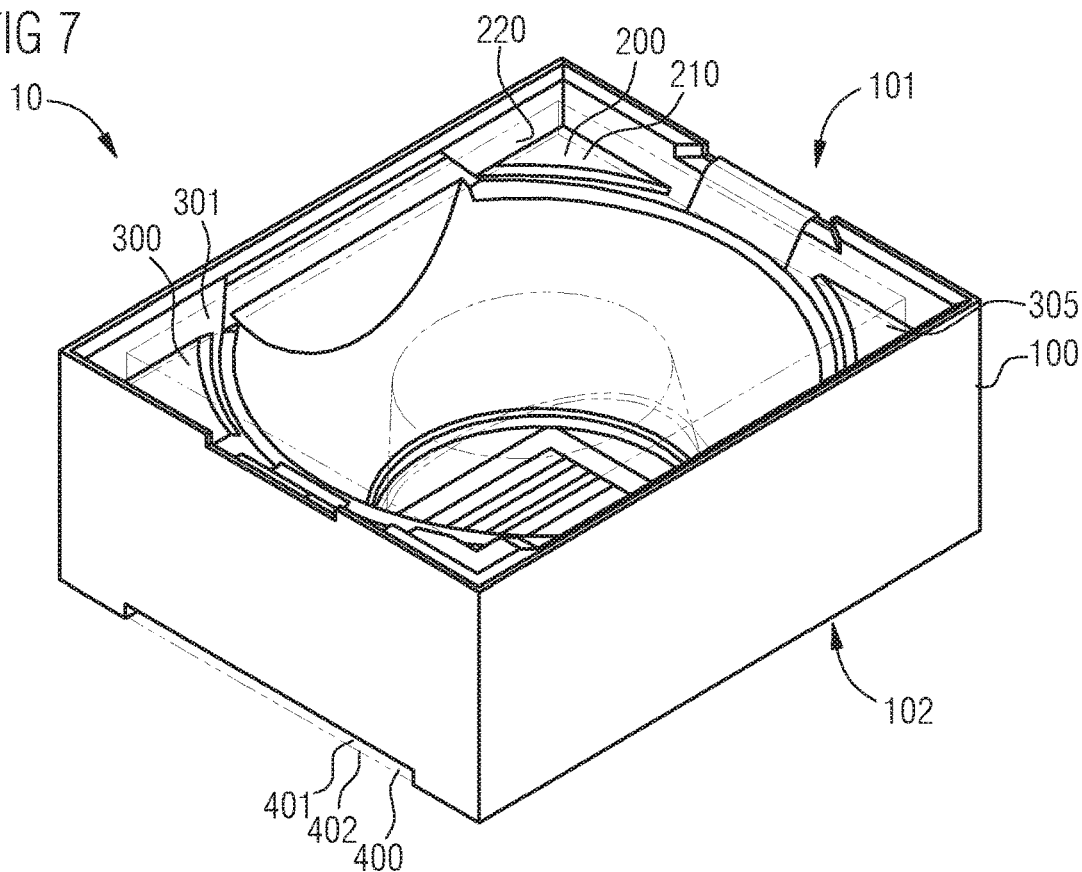
FIG. 7 shows a partially transparent perspective view of the optoelectronic component.
Figure 8:
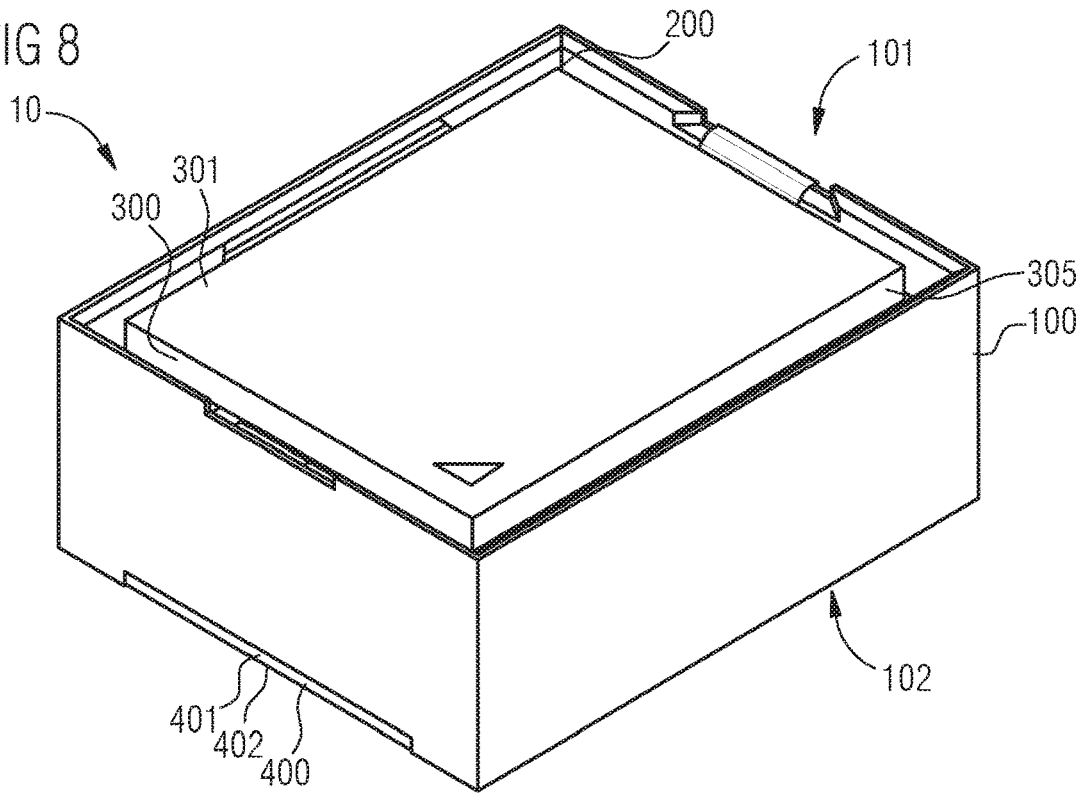
FIG. 8 shows a further perspective view of the optoelectronic component.

FIG. 6 shows a schematic sectional view of the housing body 100, the carrier 400 and the optoelectronic semiconductor chip 500 after assembling the optical element 300 to complete the manufacturing of an optoelectronic component 10. FIG. 7 shows a schematic and partially transparent perspective view of the optoelectronic component 10. FIG. 8 shows a further schematic perspective view of the optoelectronic component 10.

The optical element 300 has been placed on the upper side 101 of the housing body 100 such that the optical element 300 is received in the rabbet 200. The lower side 302 of the optical element 300 is oriented towards the housing body 100 and the carrier 400. The bearing surfaces 320 of the brim 310 of the optical element 300 rest on the shoulder 210 of the rabbet 200.

The glue 260 previously arranged on the shoulder 210 of the rabbet 200 holds the optical element 300 in the rabbet 200. The glue 260 is arranged between the shoulder 210 of the rabbet 200 and the bearing surfaces 320 of the brim 310 of the optical element 300. Some amount of the glue may have been pushed to a region between the cheek 220 of the rabbet 200 and the brim 310 of the optical element 300. Some of the glue 260 may have flown into the cavity no and may cover a part of the side wall 140 of the cavity no forming the reflector 150.

It is convenient that the height 211 of the shoulder 210 of the rabbet 200 of the housing body 100 approximately equals the thickness 311 of the brim 310 of the optical element 300. The height 211 of the shoulder 210 of the rabbet 200 may differ from the thickness 311 of the brim 310 of the optical element 300 by not more than 10% or by not more than 20% or by not more than 40% or by not more than 50 µm, for example.

It is convenient that the size of the board 305 of the optical element 300 is a little smaller than the area of the rabbet 200 of the housing body 100. This allows that a small gap 250 is formed between the brim 310 of the optical element 300 and the cheek 220 of the rabbet 200 when the optical element 300 is received in the rabbet 200. The gap 250 may comprise a width 251 measured near the shoulder 210 of the rabbet 200 which is below 200 µm or below 100 µm, for example.

The optical element 300 received in the rabbet 200 covers the opening 120 of the cavity 110 of the housing body 100.

The optical lens 330 of the optical element 300 extends into the cavity 110 of the housing body 100. The outer surface of the outer section 350 of the optical lens 330 may closely follow the shape of the side wall 140 of the cavity 110. If the optical lens 330 is asymmetric, the cavity 110 of the housing body 100 may have an according asymmetry.

The recessed inner section 360 of the optical lens 330 leaves enough space for the optoelectronic semiconductor chip 500 arranged on the upper side 401 of the carrier 400. The optical lens 330 of the optical element 300 may comprise a notch 370 for receiving the bond wire 510.

A solder pad 430 is arranged at the lower side 402 of the carrier 400. The solder pad 430 is arranged opposite to the die attach pad 410 arranged on the upper side 401 of the carrier 400. The die attach pad 410 and the solder pad 430 are electrically connected to each other by a plurality of via contacts 440 that extend through the carrier 400. The solder pad 430 thus provides an electric connection to the optoelectronic semiconductor chip 500 of the optoelectronic component 10. The solder pad 430 allows to electrically connect the optoelectronic component 10 by means of a surface mount technology, for example, by reflow soldering.

The via contacts 440 may not only provide an electrical connection between the die attach pad 410 and the solder pad 430, but may also provide a good thermal contact. Heat generated by the optoelectronic semiconductor chip 500 during operation of the optoelectronic component 10 may be removed through the die attach pad 410, the via contacts 440 and the solder pad 430.

Figure 9:
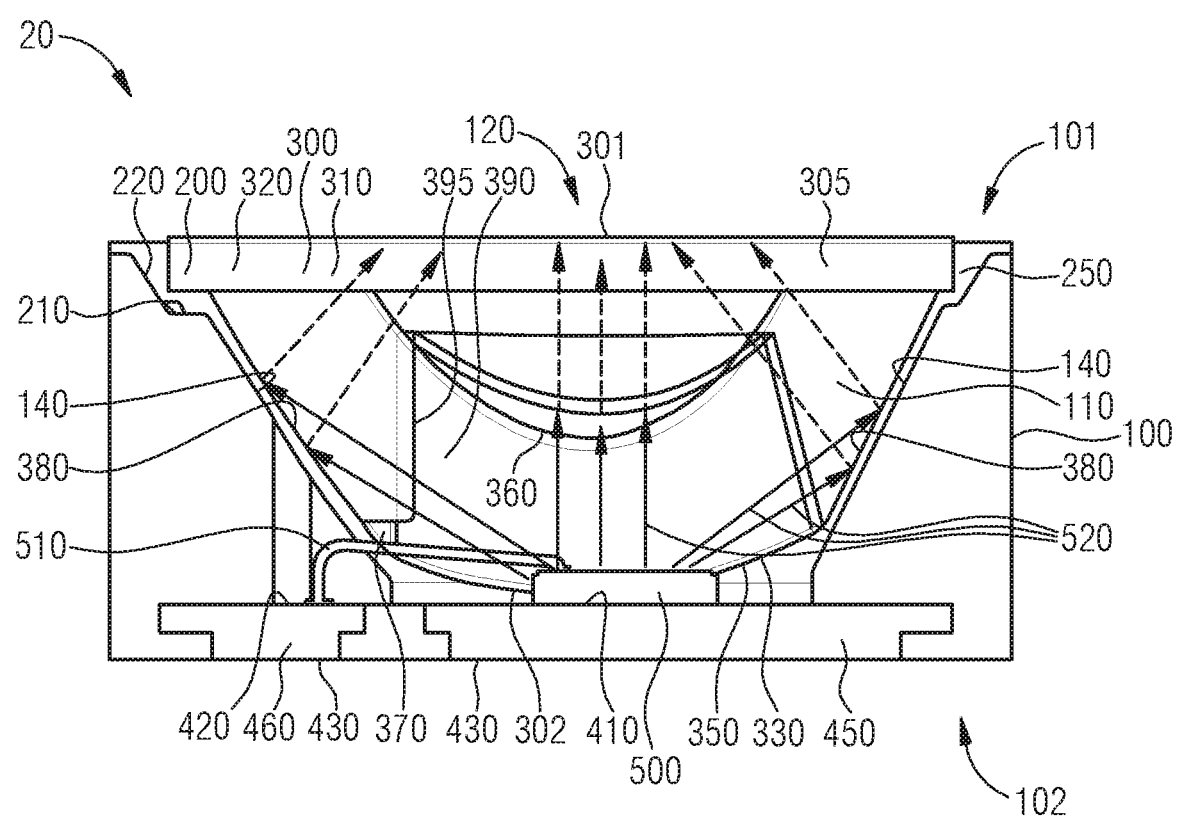
FIG. 9 shows a sectional view of a further optoelectronic component comprising a housing body, an optoelectronic semiconductor chip and an optical element.

FIG. 9 shows a schematic sectional view of an optoelectronic component 20. The optoelectronic component 20 shown in FIG. 9 is similar to the optoelectronic component 10 illustrated in FIGS. 6 to 8 such that the above description of the optoelectronic component 10 is valid also for the optoelectronic component 20 of FIG. 9 except for the differences explained in the following. For elements of the optoelectronic component 20 that correspond to similar or equal elements of the optoelectronic component 10, the same reference numbers have been used in FIG. 9 as in FIGS. 6 to 8.

Just like the optoelectronic component 10 shown in FIGS. 6 to 8, the optoelectronic component 20 shown in FIG. 9 comprises a housing body 100 with a cavity no with a side wall 140. The optoelectronic component 20 also comprises the optical element 300 with the outer surface 380. The optical element 300 is arranged on the housing body 100 such that the outer surface 380 faces the side wall 140 of the cavity no of the housing body 100. In particular, the optical element 300 is arranged on the housing body 100 such that the optical lens 330 of the optical element 300 extends into the cavity no of the housing body 100. The outer surface 380 of the optical lens 330 faces the side wall 140 of the cavity no. This is the same arrangement as in the optoelectronic component 10 shown in FIGS. 6 to 8. In particular, the optical element 300 of the optoelectronic component 20 is identical to the optical element 300 of the optoelectronic component 10.

In the optoelectronic component 20 of FIG. 9, the side wall 140 of the cavity no of the housing body 100 does not comprise a gold coating. Light 520 emitted by the optoelectronic semiconductor chip 500 is radiated into the funnel 390 at the lower side 302 of the optical element 300. Light 520 emitted at a low angle with respect to a direction perpendicular to the upper side of the optoelectronic semiconductor chip 500 enters the inner section 360 of the optical lens 330 of the optical element 300 and is deflected and concentrated by the inner section 360 of the optical lens 330 of the optical element 300. Light emitted as a large angle with respect to a direction perpendicular to the upper side of optoelectronic semiconductor chip 500 enters the outer section 350 of the optical lens 330 of the optical element 300 through the funnel wall 395 of the funnel 390 at the lower side 302 of the optical element 300. This light propagates inside the outer section 350 of the optical lens 330 of the optical element 300 until it reaches the outer surface 380 of the outer section 350 of the optical lens 330. At the outer surface 380, the light is reflected by total internal reflection. The light reflected at the outer surface 380 of the outer section 350 of the optical lens 330 is thus also concentrated by the optical lens 330 of the optical element 300 and can be extracted from the optical element 300 at the upper side 301 of the optical element 300. Because the light emitted by the optoelectronic semiconductor chip 500 at a large angle is collected by the outer surface 380 of the optical lens 330 by total internal reflection, it is not necessary that the side wall 140 of the cavity no of the housing body 100 comprises a coating to increase the reflectivity of the side wall 140 of the cavity 110.

The housing body 100 of the optoelectronic component 20 shown in FIG. 9 is slightly different from the housing body 100 of the optoelectronic component 10 shown in FIGS. 6 to 8. The housing body 100 of the optoelectronic component 20 does not comprise a cut-out at the lower side 102 of the housing body 100. Instead, the cavity no of the housing body 100 of the optoelectronic component 20 is closed at the bottom. The optoelectronic component 20 does not comprise a carrier separate from the housing body 100. Instead, the housing body 100 of the optoelectronic component 20 comprises a first lead frame section 450 and a second lead frame section 460 embedded into the housing body 100 at the lower side 102 of the housing body 100. The first lead frame section 450 forms the die attach pad 410 at the bottom of the cavity no and a solder pad 430 at the lower side 102 of the housing body 100. The second lead frame section 460 forms the wire attach pad 420 at the bottom of the cavity no and a further solder pad 430 at the lower side 102 of the housing body 100. The housing body 100 of the optoelectronic component 20 shown in FIG. 9 may comprise an epoxy mold compound, for example.

In the optoelectronic component 20 shown in FIG. 9, the housing body 100 comprises the rabbet 200 with the shoulder 210 and the cheek 220 at the upper side 101 of the housing body 100, just like the housing body 100 of the optoelectronic component 10 shown in FIGS. 6 to 8. The optical element 300 of the optoelectronic component 20 is identical to the optical element 300 of the optoelectronic component 10 and comprises the board 305 with the brim 310 forming the bearing surface 320. It is, however, possible to design the housing body 100 and the optical element 300 of the optoelectronic component 20 differently such that the optical element 300 of the optoelectronic component 20 is not received in a rabbet 200 of the housing body 100. For example, the optical element 300 may rest on a flat surface at the upper side 101 of the housing body 100.

The invention has been illustrated and described in more specific detail on the basis of the preferred exemplary embodiments. Nevertheless, the invention is not restricted to the examples disclosed. Rather, other variations can be derived therefrom by the person skilled in the art, without departing from the scope of protection of the invention.

The invention claimed is:

1. An optoelectronic component comprising:
   a housing body comprising a rabbet having a shoulder and a cheek; and
   an optical element comprising an outer surface and an optical lens
   wherein the rabbet is located on an upper side of the housing body,
   wherein the optical element is located in the rabbet such that a brim of the optical element rests on the shoulder of the rabbet,
   wherein the upper side of the housing body comprises a rectangular shape,
   wherein the shoulder of the rabbet is located only at corners of the rabbet,
   wherein the housing body comprises a cavity having a cavity sidewall and an opening at the upper side of the housing body,
   wherein the optical lens is arranged on a lower side of the optical element, the optical element extending into the cavity,
   wherein a gap is located between the brim of the optical element and the cheek of the rabbet, the gap comprising a width below 200 μm,
   wherein a glue is arranged between the shoulder of the rabbet and the brim of the optical element and extends into the gap between the cheek of the rabbet and the brim of the optical element, and
   wherein the cheek with the gap is configured to prevent the glue from being squeeze out to an outside of the housing body.

2. The optoelectronic component according to claim 1, wherein a height of the rabbet differs from a thickness of the brim of the optical element by less than 40%.

3. The optoelectronic component according to claim 1, wherein an obtuse angle is enclosed between the cheek of the rabbet and the shoulder of the rabbet.

4. The optoelectronic component according to claim 1, wherein the rabbet encircles the opening of the cavity.

5. The optoelectronic component according to claim 1, wherein the optical element covers the opening of the cavity.

6. The optoelectronic component according to claim 1, wherein the optical lens is asymmetric.

7. The optoelectronic component according to claim 1, wherein the optoelectronic component comprises a carrier having a die attach pad arranged on an upper side of the carrier and a solder pad arranged on a lower side of the carrier, and wherein the housing body is arranged on the upper side of the carrier.

8. The optoelectronic component according to claim 7, wherein at least one via contact extends through the carrier between the die attach pad and the solder pad.

9. The optoelectronic component according to claim 7, wherein a lower side of the housing body comprises a cut-out, and wherein an optoelectronic semiconductor chip is arranged on the die attach pad of the carrier in the cut-out of the housing body.

10. The optoelectronic component according to claim 1, wherein the glue is partially arranged between the cavity sidewall and the outer surface of the optical element.

11. The optoelectronic component according to claim 1, wherein the gap comprises a width below 100 μm.

12. An optoelectronic component comprising:
   a housing body comprising a rabbet having a shoulder and a cheek; and
   an optical element,
   wherein the rabbet is located on an upper side of the housing body,
   wherein the optical element is located in the rabbet such that a brim of the optical element rests on the shoulder of the rabbet,
   wherein the upper side of the housing body comprises a rectangular shape,
   wherein the shoulder of the rabbet is located only at corners of the rabbet,
   wherein the housing body comprises a cavity having a cavity sidewall and an opening at the upper side of the housing body,
   wherein the cavity sidewall comprises s a reflector,
   wherein a glue is arranged between the shoulder of the rabbet and the brim of the optical element, and
   wherein the glue is partially arranged between the reflector and an outer surface of the optical element so that the optoelectronic component is configured to emit homogenous light.

13. The optoelectronic component according to claim 12, wherein a height of the rabbet differs from a thickness of the brim of the optical element by less than 40%.

14. The optoelectronic component according to claim 12, wherein a gap is located between the brim of the optical element and the cheek of the rabbet, and wherein the gap comprises a width below 200 μm.

15. The optoelectronic component according to claim 12, wherein the optical element is an optical lens that is asymmetric.

16. The optoelectronic component according to claim 15, wherein the reflector comprises a gold coating.

* * * * *